United States Patent [19]

Barry

[11] 4,199,745

[45] Apr. 22, 1980

[54] DISCRETE ELECTRICAL COMPONENTS

[75] Inventor: Richard L. Barry, North Attleboro, Mass.

[73] Assignee: TRX, Inc., Attleboro Falls, Mass.

[21] Appl. No.: 860,862

[22] Filed: Dec. 15, 1977

[51] Int. Cl.² .............................................. H01C 1/01
[52] U.S. Cl. ................................... 338/320; 338/308; 338/309; 338/314
[58] Field of Search ........ 338/320, 322, 328, 307–309, 338/312–314, 323, 324; 29/610, 620, 621, 626; 357/28, 80; 427/101, 102, 123–126

[56] References Cited

U.S. PATENT DOCUMENTS

| 2,927,048 | 3/1960 | Pritikin | 427/101 X |
| 3,254,274 | 5/1966 | Garcia et al. | 357/80 |
| 3,483,308 | 12/1969 | Wakely | 29/626 X |
| 3,887,893 | 6/1975 | Brandt et al. | 338/308 X |
| 3,964,087 | 6/1976 | Mallon | 338/308 X |

Primary Examiner—C. L. Albritton

[57] ABSTRACT

A matrix of discrete spaced electrical components (which may be individual components or networks, for example) in fixed array on a substrate wafer, each component being connected to terminal conductor pads on the opposite surface of the substrate by thick film conductor strips that extend along the walls of apertures in the wafer.

5 Claims, 7 Drawing Figures

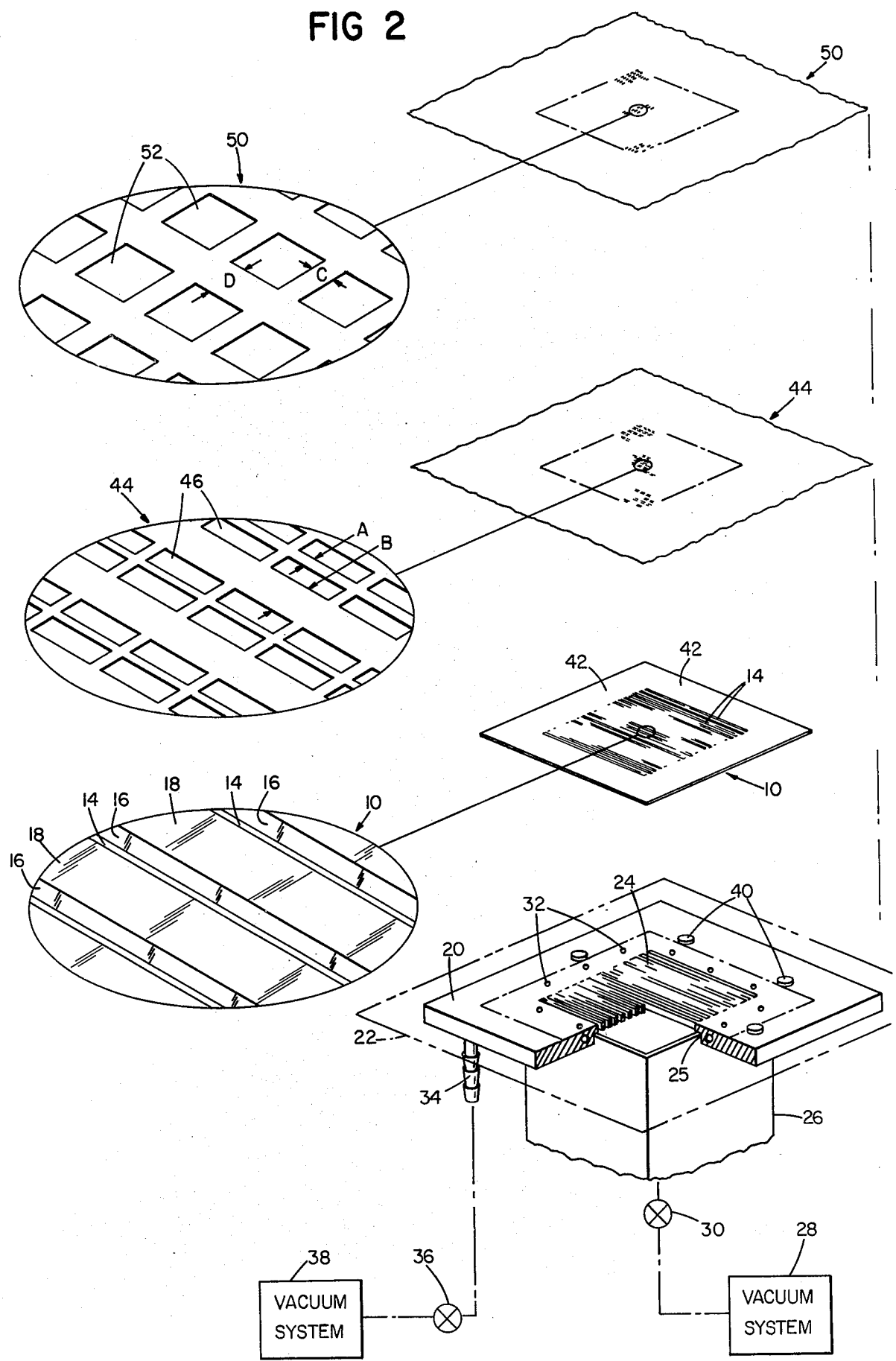

DISCRETE ELECTRICAL COMPONENTS

This invention relates to discrete electrical circuit components and to the fabrication of such components by thick film techniques.

With thick film technolgy, a variety of discrete components such as resistors, resistor networks, capacitors and inductors may be fabricated to meet specific circuit design requirements. Thick film chip resistors are an example of such circuit components and it is a particular object of this invention to provide novel thick film resistor components and improved manufacturing processes resulting in improved component yield. Chip resistors manufactured in accordance with the invention are discrete components that are economically produced and are available in a wide range of resistance values and resistance tolerances. Chip components produced in accordance with a feature of the invention may have dimensional compatibility for microstrip and stripline applications, for example components twenty mils (0.5 millimeter) in width and thirty mils (0.75 millimeter) in length with wrap around terminations. Such components offer physical and thermal ruggedness as well as significant attachment simplifications.

In accordance with another feature of the invention, there is provided an electrical component fabrication process that comprises the steps of depositing electrically conductive material on one surface of a substrate of electrically insulating material, with thick film techniques and drawing deposited material along the edge of the substrate towards the opposite surface. In particular embodiments, the substrate has apertures, discrete component elements are on one surface of the substrate and are electrically connected to terminal pads on the opposite surface of the substrate by conductive layers on the aperture walls.

The resulting article is a matrix of discrete spaced electrical components (which may be individual components or networks, for example) in fixed array on a substrate wafer, each component being connected to terminal conductor pads on the opposite surface of the substrate by thick film conductor strips that extend along the walls of the apertures. This array of electronic components features handling convenience, including trimming of resistor portions for example, measuring of the components by scanning the entire wafer using a probe card technique for example, and storing component data in a computer memory for inventory control. The wafer array of components is conveniently stored in inventory. When required the component terminals may be tinned while the components are in wafer array form. When components are to be used, the wafer is diced by conventional techniques into the desired chip geometries. The resulting individual components have wrap around terminations which facilitate circuit attachment.

Other features and advantages of the invention will be seen as the following description of a particular embodiment progresses, in conjunction with the drawings, in which:

FIG. 2 is a diagrammatic exploded view of the wafer, a chuck and associated vacuum system and printing screens employed in a manufacturing process;

DESCRIPTION OF PARTICULAR EMBODIMENT

Figure 1:
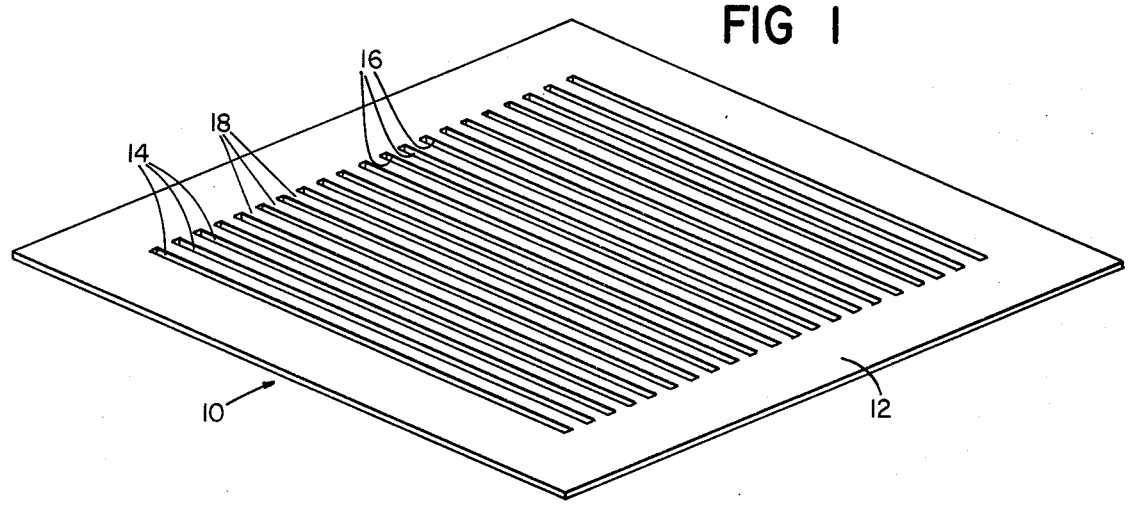
FIG. 1 is a perspective view of a ceramic wafer in accordance with the invention.

The wafer substrate 10 shown in FIG. 1 is of a high alumina ceramic with conventional surface finish, 0.015 inch (15 mils—about 0.4 millimeter) thick and two inches (about five centimeters) on each side with parallel upper and lower surfaces 12. A series of parallel slots 14 with vertical side walls 16 are formed in wafer 10 by plunge cutting with a diamond saw, each slot 14 being twenty mils (0.5 millimeter) in width and the slots being spaced from one another by lands 18 each fifty mils (about 1.25 millimeter) in width.

Conductor and resistor compositions are deposited on the slotted substrate 10 utilizing conventional thick film screen printing technology. With reference to FIG. 2, vacuum chuck 20 is mounted on platen 22 of a printing machine. Chuck 20 has a slotted central area 24 and a recessed seat 25 on its lower surface which is received in vacuum sealed relation on vacuum channel 26 so that slotted area 24 is in aligned connection with the vacuum channel 26. Channel 26 is connected to vacuum system 28 through vacuum control 30. Chuck 20 also has a series of secondary ports 32 in its upper surface extending around the periphery of slotted area 24. Secondary ports 32 are connected to a vacuum line (via coupling 34) which line is connected through control 36 to a suitable separate vacuum system 38. Projecting aligning stops 40 on chuck 20 facilitate the proper positioning of wafer substrate 10 on vacuum chuck 20. Wafer 10 is positioned so that its unslotted marginal area 42 overlies the secondary ports 32 and its slots 14 are aligned with the slots in vacuum area 24. Application of vacuum to the secondary ports 32 via control 36 holds the substrate 10 in place with its slots 14 exposed to primary vacuum channel 26.

A first printing screen 44 of conventional type is employed for printing an array of conductor patterns and a second printing screen 50 is employed for printing a cooperating array of resistor patterns. The apertures 46, 52 in each screen 44, 50 are formed in conventional manner. In this embodiment, screen 44 is formed with a series of transverse rows of apertures 46 spaced so that each row of apertures 46 will overlie the edge 16 of a slot 14 when screen 44 is properly aligned with wafer 10. Each aperture 46 has a length of 48 mils and a width of 17 mils, and the apertures in each row are spaced eleven mils apart. The closer distance between adjacent rows of apertures (dimension A) is six mils and the greater distance between adjacent rows (dimension B) is thirty mils.

Resistor screen 50 has an array of apertures 52, similarly disposed in transverse rows. Each aperture 52 has a width of forty mils and a length of forty mils. Apertures 52 are spaced nineteen mils apart in each transverse row (dimension C) and the edges of apertures 50 in adjacent rows are spaced thirty mils apart (dimension D) so that apertures 52 overlie lands 18 when screen 50 is properly aligned with wafer 10.

Figure 3:
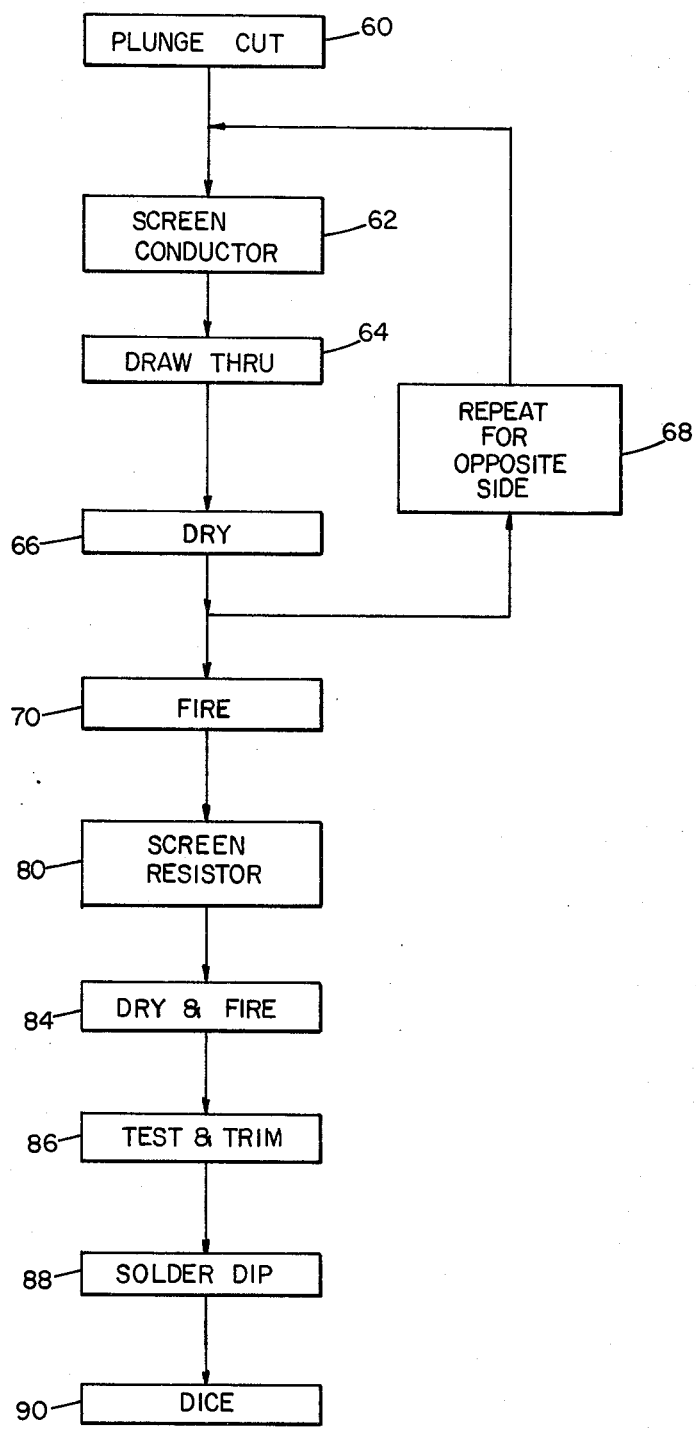
FIG. 3 is a flow chart of a processing sequence in accordance with the invention.

A flow diagram of a production process is shown in FIG. 3. In that process, slots 14 are first cut in ceramic wafer 10 in a plunge cutting operation with a diamond saw as indicated by block 60. The slotted wafer 10 is then placed on vacuum chuck 20 and secured in position by application of vacuum via control 36. Screen 44 is positioned in conventional manner in accurate alignment with and over wafer substrate 10. Conductor paste is applied to screen 44 in a conventional flood stroke, substrate 10 is then brought into full contact with screen 44 by raising the vacuum chuck 20, and the print stroke is activated to force the viscous conductor paste through openings 46 to deposit paste on the margin of each substrate land 18 and over the adjacent slot area in the step indicated in block 62. Vacuum control 28 is then operated to apply vacuum to primary channel 26 and the resulting pressure differential draws the deposited conductor paste down along the slot walls 16 in the step indicated in block 64. Vacuum is then removed from channel 26 by control 28 and the chuck 20 is lowered and moved from under screen 44 to its orginal position. The ceramic wafer 10 is removed from chuck 20 and the conductor paste is dried as indicated by block 66 at the paste manufacture's recommended drying times and temperature.

The ceramic wafer 10 is then repositioned on the vacuum chuck 20 in inverted position and the conductor printing sequence of steps 62, 64, 66 is repeated as indicated by block 68. The wafer is then transported through a high temperature conveyor furnace to fire the deposited conductor elements in accordance with the manufacturer's specifications in the step indicated in block 70, the resulting terminal pads 74 being about one-half mil thick. At this point in the production process, an array of wrap around conductors 72 (FIG. 4) has been completed, each conductor 72 including a terminal pad 74 on the upper surface of land 18, a corresponding terminal pad on the opposite (lower) surface of the land and a connector layer 76 (formed by the two vacuum draw through steps 64) extending along the slot wall 16 between the two terminal pads 74.

Figure 4:
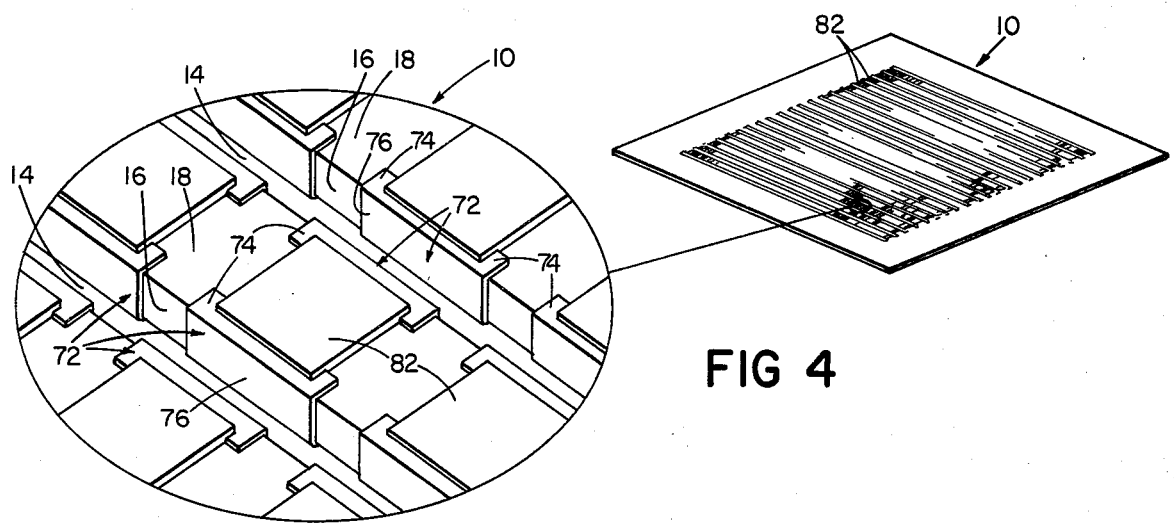
FIG. 4 is a perspective diagrammatic view of a wafer array of thick film resistors in accordance with the invention.

Wafer 10 with the fired conductor patterns 72 is then again placed on vacuum chuck 20 in its original alignment and secured in position by vacuum applied to ports 32. Screen 50 is positioned in conventional manner above and in accurate alignment with substrate 10 as secured on chuck 20 and resistor paste is applied through apertures 52 in a sequence of steps as indicated by block 80 including a flood stroke and an offcontact printing sequence that forces the resistor paste through openings 52 to deposit resistor patterns 82 (FIG. 4) that extend between the terminal pads 74 on the upper surface of each wafer land 18 as indicated in FIG. 4. The array of deposited resistor elements 82 is then dried and fired as indicated by block 84 in accordance with the manufacturer's specifications. Excellent yield is obtained as the resistor elements are subjected to only one firing in this production sequence.

Figure 5:
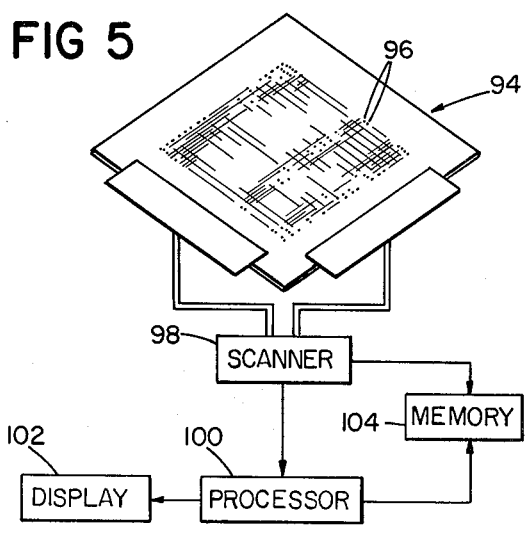
FIG. 5 is a diagrammatic view of circuitry for testing the wafer of FIG. 4.

The resulting array of discrete resistors is shown in FIG. 4, each resistor element 82 being connected to two discrete conductor patterns 72 each of which include a wrap around connection 76 and a terminal pad 74 on the lower surface of wafer 10. Each resistor 82 may be trimmed in conventional manner with laser or abrasive techniques as required as indicated by block 86. Optionally, solder is applied to the wrap around terminations 72 of the resistor array by using conventional techniques as indicated by block 88. When resistors are desired for use, wafer 10 is diced, as indicated by block 90 into resistor elements 92 that are fifty mils in length and fifty mils in width. Resistors in other dimensional sizes are similarly manufactured, including chip resistors twenty mils in width and thirty mils in length that are compatible with common 50 ohm stripline and microstrip systems. The two-inch by two-inch wafer array of chip resistors 92 facilitates handling, measurement, trimming, and inventory storage. For example, the resistors 92 in the wafer array may be individually measured by placing the wafer on semiconductor scanning type array 94 of probes 96 connected to scan selector 98 as indicated in FIG. 5. Probes 96 are spaced to engage terminal pads 74 and thus connect resistors 82 to measurement device 100 so that the value of each resistor as selected by scanner 98 is indicated at display 102. In addition, the values of the resistors in the array may be stored in coordinate form in conventional computer memory 104. A printout of the values of the resistors in each wafer array could be stored with the wafer in inventory.

Figure 6:
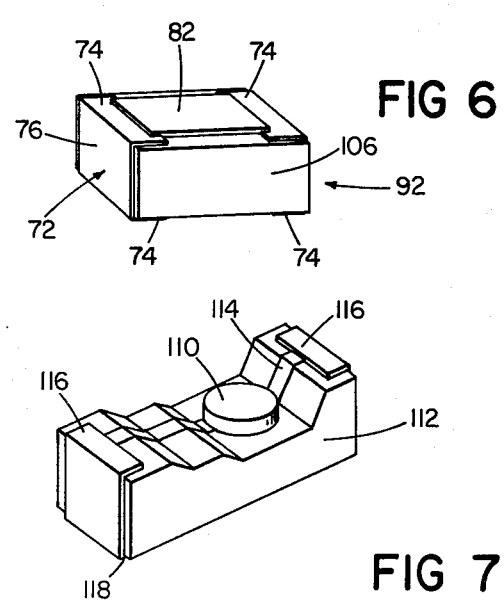
FIG. 6 is a perspective view of a discrete thick film resistor obtained from the wafer of FIG. 4.

A perspective view of the resulting discrete chip resistor 82 after dicing is shown in FIG. 6. That thick film chip resistor includes a rectangular fifteen mil thick insulator body 106 with resistor portion 82 on its upper surface and terminal pads 74 at either end on its lower surface. The pads 74 and wrap around conductors 76 are spaced in the array shown in FIG. 4 so that in dicing the wafer, only ceramic material is removed and the edge surface of the conductor and resistor material are not disturbed and are spaced inwardly from the sides of the insulator body 106 as shown in FIG. 6.

Figure 7:
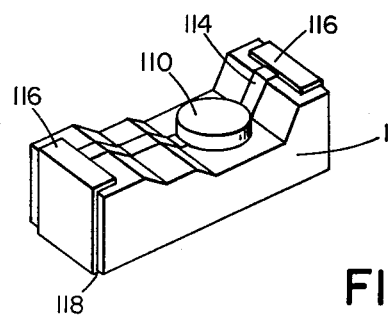
FIG. 7 is a perspective view of another electronic component manufactured in accordance with the invention.

As indicated above, a wide range of resistance values and resistance tolerances are available in resistors manufactured in accordance with the invention. The configuration of the top and bottom terminal pads may be different. Other electronic components and networks may also be manufactured utilizing the invention. An example of another such component is shown in FIG. 7, that component being of the leadless inverted device (LID) type and having a semiconductor component 110 mounted on chip 112 and connected via deposited conductors 114 and wrap around conductors 116 to terminal pads 118 on the lower surface of chip 112.

Other embodiments will be apparent to those skilled in the art.

What is claimed is:

1. An array of electrical circuit components comprising a substrate having upper and lower surfaces, a plurality of apertures in said substrate extending through said substrate between said upper and lower surfaces, discrete spaced electrical components on the upper surface of said substrate, terminal pads on said lower surface of said substrate, at least two terminal pads corresponding to each electrical component, and at least two discrete conductor strips extending along the walls of each said aperture, each said conductor strip electrically connecting a corresponding terminal pad to its associated electrical component.

2. The array as claimed in claim 1 wherein said through apertures are parallelly extending slots.

3. The array as claimed in claim 1 wherein said terminal pads and said conductor strips are of thick film dimensions.

4. The array as claimed in claim 3 and further including a corresponding array of discrete spaced terminal pads of thick film dimensions on said upper substrate surface, each said conductor strip extending between and electrically connecting a terminal pad on said upper surface and a corresponding terminal pad on said lower surface.

5. The array as claimed in claim 4 wherein said discrete electrical components are resistor elements of thick film dimension.

* * * * *